Oct. 4, 1966 B. D. GRINDLE ETAL 3,277,395

PULSE WIDTH MODULATOR

Filed Nov. 18, 1963 4 Sheets-Sheet 1

Oct. 4, 1966 B. D. GRINDLE ET AL 3,277,395

PULSE WIDTH MODULATOR

Filed Nov. 18, 1963 4 Sheets-Sheet 2

United States Patent Office 3,277,395

Patented Oct. 4, 1966

3,277,395

PULSE WIDTH MODULATOR

Blaine D. Grindle, Vestal, and Hermann Schmid, Binghamton, N.Y., assignors to General Electric Company, a corporation of New York Filed Nov. 18, 1963, Ser. No. 324,263
3 Claims. (Cl. 332—9)

This invention relates to electronic circuits for deriving pulse width modulated signals wherein an input D.-C. signal proportionately controls the pulse durations in an output pulse train. Useful applications include analog computers, analog-to-digital converters, telemetering systems and similar applications.

Most conventional pulse width modulators employ a closed-loop circuit with a voltage or current switch and a low-pass filter in the feedback to obtain high accuracy. These devices require highly sophisticated D.-C. operational amplifiers with high gain and low drift. The feedback loop of these circuits create stability problems and the low-pass filter severely limits the bandwidth.

Another class of pulse width modulators developed for telemetering applications employs a method of linearly charging and discharging a capacitor. The main design objective in this application is to minimize the bandwidth of the transmitted data. This objective is obtained by operating with a variable repetition frequency (delta-sigma modulation).

In pulse-time analog computers and pulse-time hybrid computers, however, the repetition frequency must be constant and synchronized with some central reference; therefore, the latter type of pulse width modulator is not applicable.

The pulse width modulator described herein also employs the method of linearly charging and discharging a capacitor but in combination with a high-speed and high accuracy comparator. It is this combination which gives the pulse width modulator improved performance with relatively simple circuits.

The time required for a linear voltage ramp, starting at zero, to reach a certain value X is directly proportional to the magnitude of X. A pulse-width modulator can thus be built if a linear voltage ramp is compared with a D.-C. voltage representing the input variable X. The precision of this modulation process is a function of the linearity of the ramp, and of the accuracy and speed of the comparator. Normally, a reference voltage would be integrated to obtain a reference ramp. The output would occur when the reference ramp and analog input are equal. The integrator must be reset each period of operation. This method has the decided disadvantage of being directly dependent on the accuracy and stability of the integrator RC time constant.

One of the most accurate prior art comparators is the precision limiter (FIGURE 1). It operates as follows: When the magnitude of the input voltage $V_i$ approaches the magnitude of the limiting or comparison voltage $V_L$, the current $i_1$ through diode 1 approaches zero, increasing the diode impedance (FIGURE 1A).

With more impedance in the feedback path, the closed loop gain of the D.-C. amplifier 5 increases; the amplifier output voltage $V_A$ becomes larger, and cuts off the diode still more. In turn, this results in an even higher feedback impedance, etc. A regenerative process starts which continues until $V_A$ reaches the Zener breakdown voltage $V_Z$ of the diodes 7 across the amplifier. The output voltage $V_o$ of this limiting circuit is determined by the current $i_2$ through the feedback resistor 2. With current $i_1$ equal to zero, $i_2$ must equal current $i_3$, and if $V_L$ is constant, $V_o$ is also constant. With no additional load, the output voltage of the limiter $$V_o=V_L\times\frac{R_2}{R_2+R_3}$$

When the gain of the D.-C. amplifier is very large, the precision with which $V_o$ is determined usually depends only on the tolerance of the resistors 2 and 3 and a magnitude of error in the order of $\pm0.01$ percent is feasible. However, the precision limiter is not fast. Typically, the amplifier output voltage $V_A$ (FIGURE 1), needs as much as 100 microseconds to rise from the value $V_o$ to $V_Z$. In a 10-volt computing system and with a 1-kilocycle voltage ramp, this would constitute an error of 10 percent of full scale.

Accordingly, it is an object of the invention to provide a pulse width modulator which is largely insensitive to variations in temperature, power supply voltages and component variations.

It is a further object to provide a pulse width modulator in which accuracy and stability is not directly dependent upon an RC time constant.

It is another object of the invention to provide a pulse width modulator which is not dependent upon absolute values of the input voltage or the reference voltages.

It is another object of the invention to provide a pulse width modulator which is not strongly dependent upon very high gain and bandwidth in the D.-C. amplifier.

Briefly stated, in accordance with certain aspects of the invention, an RC integrator being a D.-C. amplifier type of pulse width modulator is provided in which accuracy is made independent of the integration RC time constant by using the same comparison reference signal for the setting of the integrator's initial condition and for the integration comparison to determine pulse width termination with an up and down integration. A ramp generating integrator in a first mode $T_{c1}$ integrates the input voltage from a comparator reference voltage level for the fixed period $T_{c1}$. In the following second mode, $T_{c2}$, a reference voltage of opposite polarity is applied to the integrator so as to return the integrator to the comparator reference voltage level. By means of a comparison amplifier in the feedforward portion of the integrator loop, return to the comparison reference is detected whereby a pulse width termination signal is generated with high precision and very fast rise time provided by a comparison amplifier, which is independent of the D.-C. amplifier characteristics.

In the foregoing preferred embodiment, the pulse modulation process takes two periods. Where it is essential that the pulse modulation be performed within a single pulse period, or for other reasons, pulse modulation can be performed with the usual ramp signal generator, having a D.-C. amplifier type of integrator, and with the comparison amplifier in the feedforward portion of the integrator loop. While such an embodiment is dependent on the RC time constant precision as in prior art pulse modulators, the pulse termination rise time is greatly improved.

The invention, together with further objects and advantages thereof, may best be understood by referring to the following description taken in conjunction with the appended drawings in which like numerals indicate like parts and in which.

Figures 1, 1A, 1B, 2:
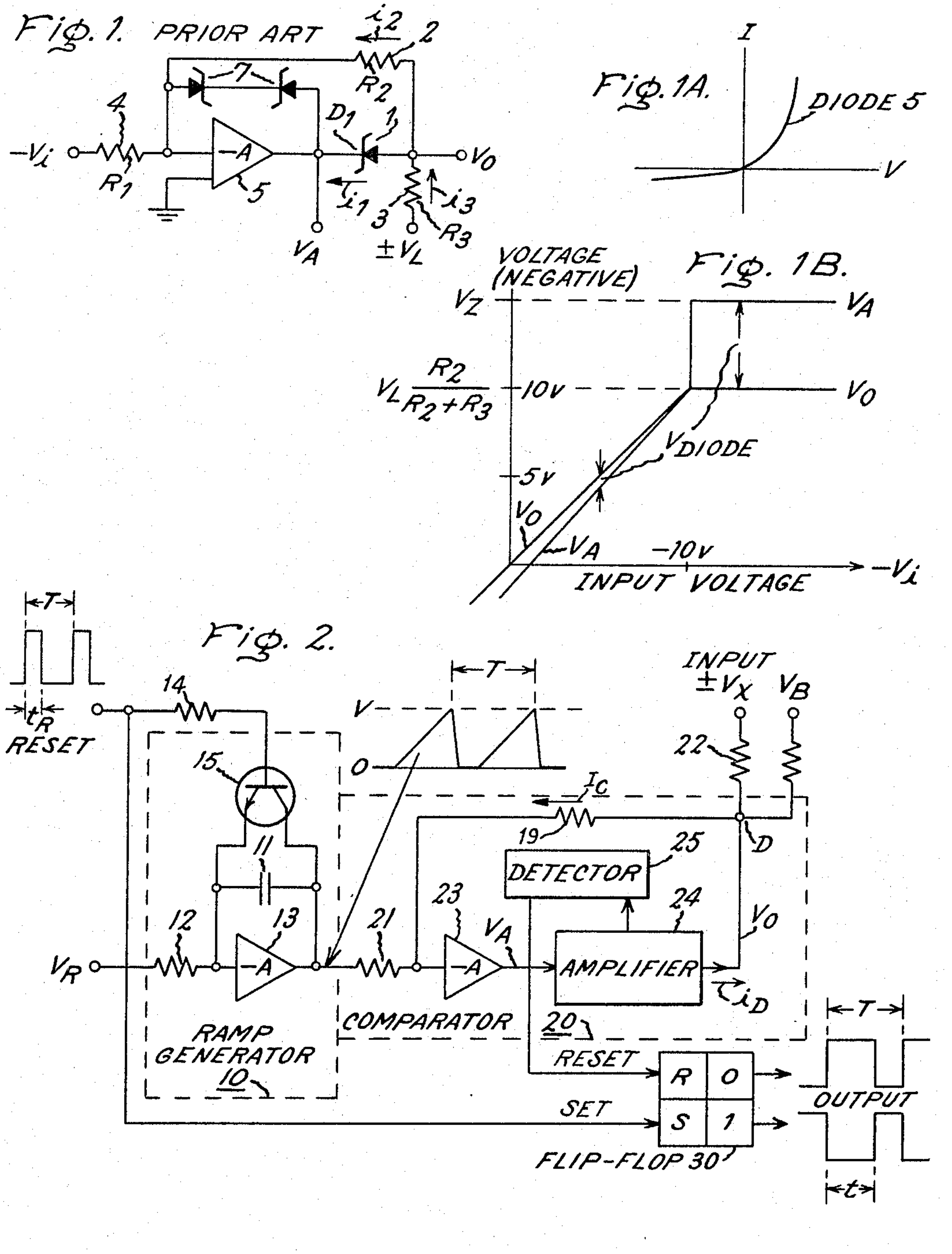
Fig. 1. PRIOR ART, Fig. 1A., Fig. 1B., Fig. 2.
FIGURES 1, 1A and 1B illustrate a prior art limiter.
FIGURES 2, 2A and 2B illustrate a first embodiment of the invention.

FIGURE 2 is a block diagram of a first embodiment of the pulse-width modulator. The ramp generator 10 illustrated is a conventional reset integrator including an input summing resistor 12 and an operational amplifier 13. The slope of the voltage ramp is proportional to the reference voltage $V_R$. Resetting the integrator is achieved by momentarily closing a normally open transistor switch 15 across the integrating capacitor 11 by means of a reset pulse applied to reset resistor 14. The voltage ramp is connected to the $V_i$ input resistor 21 of the precision comparator 20 and the input variable $V_X$ is connected to resistor 22 having a resistance $R_X$. For two-quadrant operation, the comparator is biased to the center of the ramp with a voltage $V_B$. To produce a pulse-width output signal, the trigger signal from the precision comparator resets output flip-flop 30 which had been set at the beginning of the integration period.

The operational amplifier 23 has a feedback resistor 19 and is connected as a limiter with amplifier 24 inserted into the forward path. When the amplifier is operating in its linear region, the circuit behaves like any conventional scale changer and the output voltage $V_o$ is related to the input voltage $V_R$ as in the FIGURE 1 limiter. When, however, the voltage-current relationship of the amplifier 24 is such that the current $I_D$ decreases as $V_A-V_o$ increases, the amplifier output voltage $V_A$ increases even more and the circuit becomes regenerative. It is the purpose of the detector 25 to determine when $V_A=V_o$ and produce a signal capable of "re-setting" the flip-flop 30, which was "set" at the start of the integration mode by the reset pulse. Ideally, $V_o$ should be equal to $V_X$, the second input voltage, when the transistor of amplifier 24 base current $I_D=0$. However, since $I_C$ is a finite current $$V_o=V_X-I_CR_X$$

i.e. it is different by a constant amount.

Figure 2A:
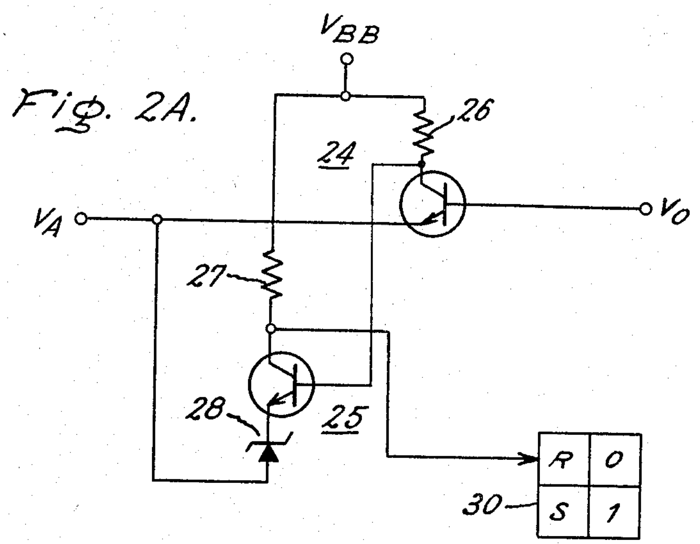

FIGURE 2A is a schematic diagram of a simple amplifier and simple detectors 24 and 25 for the FIGURE 2 pulse width modulator. The amplifier 24 is a transistor which has negligible impedance across the emitter-base junction when the D.C. operational amplifier 23 output $V_A$ is less than comparison voltage $V_o$. However, when $V_A$ approaches $V_o$, the amplifier 24 turns off in a few microseconds regeneratively. This is accompanied by a corresponding rise in $V_A$ with voltage relationships like FIGURE 1A. Detector 25 is a transistor which is responsive to the collector voltage of transistor 24 and generates a reset pulse for flip-flop 30. Transistor 24 and its load resistor 26 are selected so as to provide minimum loading impedance when "ON" to prevent premature "TURN-OFF." Transistor 25 and load resistor 27 together with Zener diode 28 are selected so as to "TURN-OFF" subsequent to the TURN-OFF of transistor 24 and to insure switching of flip-flop 30.

Figure 2B:
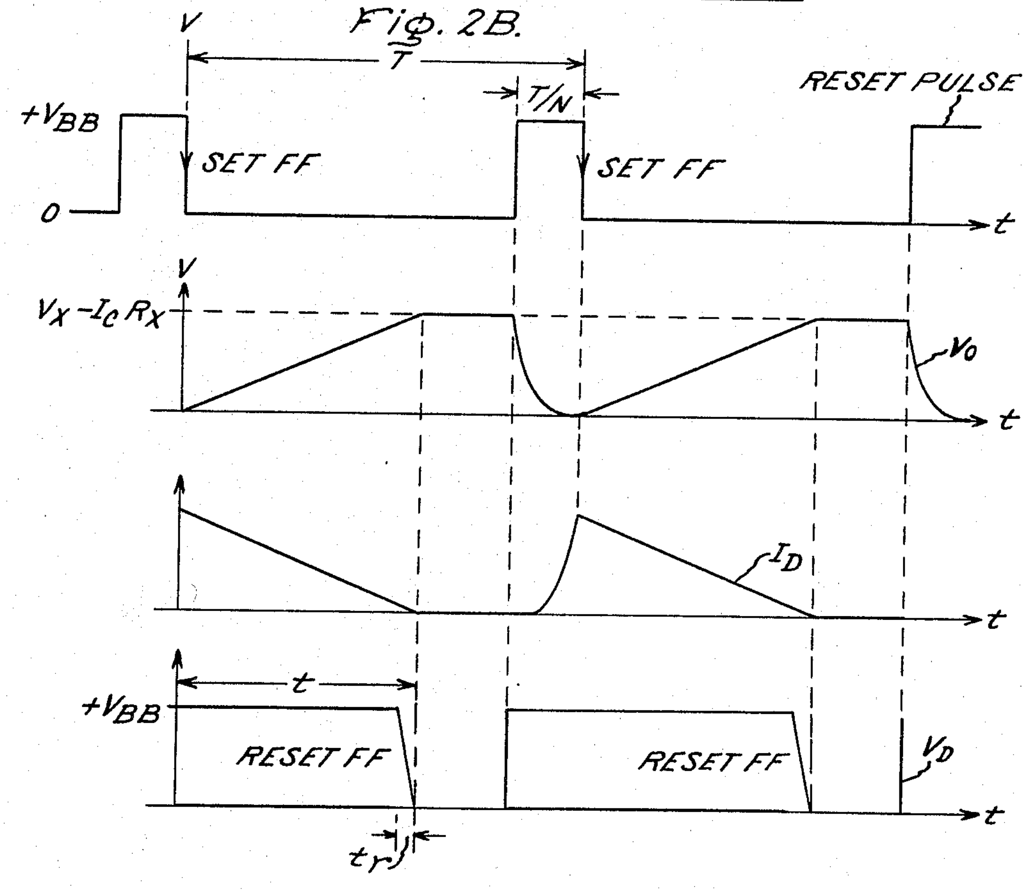

Referring to the waveforms of FIGURE 2B, the operation of this pulse width modulator can thus be summarized as follows: At time $t=0$ with the reset pulse returned to zero, linear integration begins, starting from $V_o=0$. $V_a$ and $V_o$ increase linearly with time until $V_o=V_X-I_CR_X$. At that time, $I_D$ must be zero and $V_D$ must fall sharply from supply voltage $+V_{BB}$. The flip-flop which had been set by the falling edge of the reset pulse is reset by the falling edge of $V_D$. The output of the flip-flop is thus a pulse with an ON-period of $t$ and repetition period T.

Figure 3:
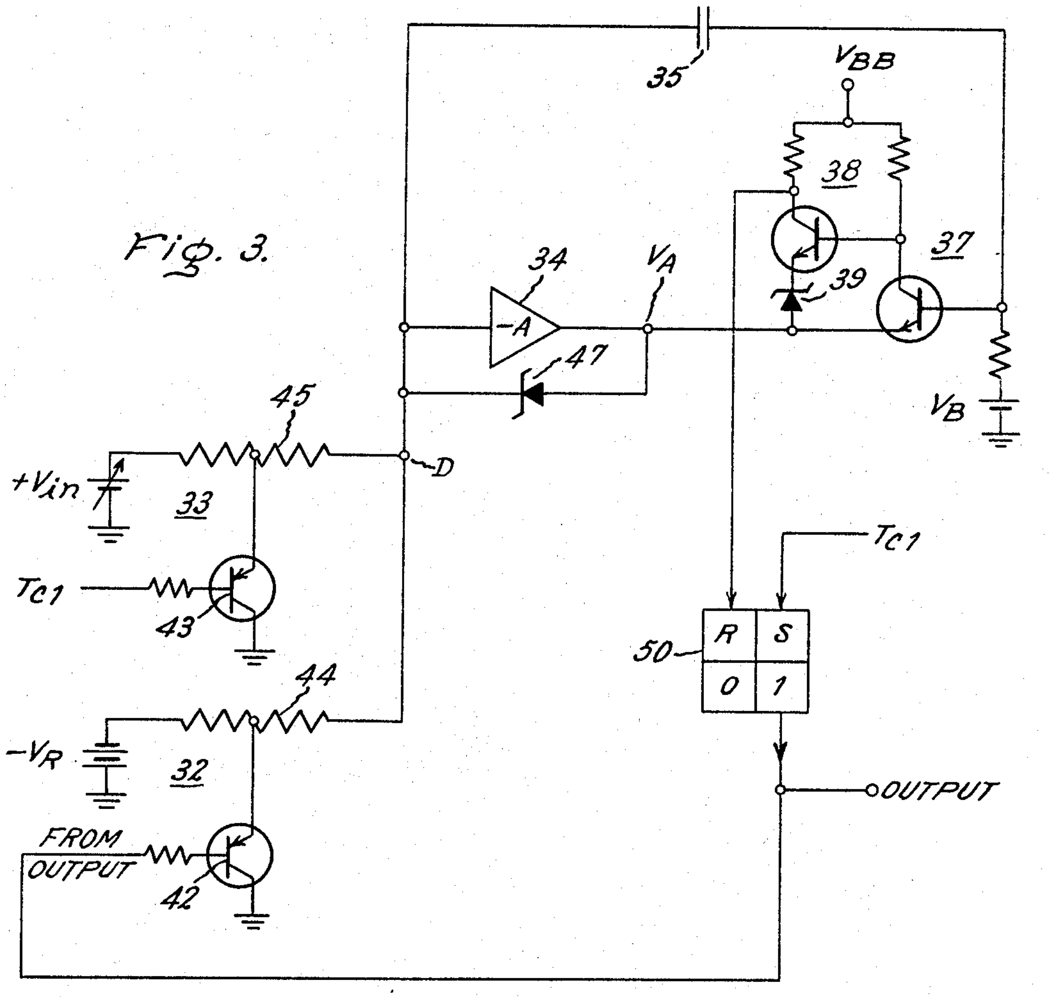
FIGURES 3 and 3A illustrate a preferred embodiment of the invention in a schematic form with descriptive waveforms.

FIGURE 3 is a schematic diagram of a preferred embodiment. Relative to the prior art, the embodiment of FIGURE 2 improves operations primarily in respect to speed. The FIGURE 3 circuit uses two basic periods, $T_{c1}$ and $T_{c2}$, to make the modulator accuracy completely independent of the integrating RC time constant and dependent only upon the ratio of the input resistors for the input voltage $V_X$ and the reference voltage $V_R$.

Input switches 32 and 33 are conventional transistor voltage switches of the shunt type. For operating temperatures below 60° C., germanium alloy junction transistors are preferred; for higher temperature, silicon transistors are required.

A conventional transistor D.-C. operational amplifier 34 and feedback capacitor 35 provide the integration function.

A one-stage current amplifier 37 and a one-stage voltage amplifier 38 having a transistor supply voltage $V_{BB}$ perform the amplifier and detector functions. The two transistors are connected into the feedback path of the integrator in such a way that the integrator sees only a low impedance junction before switching. When the comparator input current $I_c$ becomes zero, the comparator provides its output signal.

The operation of this modulator is divided into two discrete modes, each lasting for a period T. The $T_{c1}$, $T_{c2}$ control signal connects the modulator alternately into the two modes by deenergizing switch 33.

With switch 33 turned "OFF," the output voltage of the integrator $V_A$ increases with a slope proportional to the input voltage $V_X$.

During $T_{c1}$, the input voltage $V_X$ is applied to the integrator so that the voltage $V_o$ is a ramp function of $V_X$.

$$V_o=\frac{V_xt}{R_1C}+V_{ref}$$

At the end of $T_{c1}$, $V_X$ is removed from the integrator input and a reference voltage $V_R$ is applied.

$$V_o=V_{ref}+\frac{V_xT_{c1}}{R_1C}$$

During $T_{c2}$ $$V_o=V_{ref}+\frac{V_xT_{c1}}{R_1C}-\frac{V_Rt}{R_2C}$$

when $$V_o=V_{ref},\ t=t_x$$

$$V_o=V_{ref}=V_{ref}+\frac{V_xT_{c1}}{R_1C}-\frac{V_Rt_x}{R_2C}$$

$$t_x=\frac{V_x}{V_R}\cdot\frac{R_2}{R_1}T_{c1}$$

or $$\frac{t_x}{T_{c1}}=\frac{V_x}{V_R}\cdot\frac{R_2}{R_1}$$

Thus, it can be seen that the only effect of capacitor 35 is to determine the voltage swing of the amplifier. Changes in C have no effect on the pulse width output. the trailing edge of the pulse output, $t_x$, is used to disconnect the reference voltage. With no input, the integrator holds a constant output voltage until the next cycle. Using this technique, the circuit is always in its zero or reference state at the beginning of each period of operation so that no reset is required. This relaxes the requirements on the D.-C. amplifier considerably since it never has to respond to a step-type input.

Figure 3A:
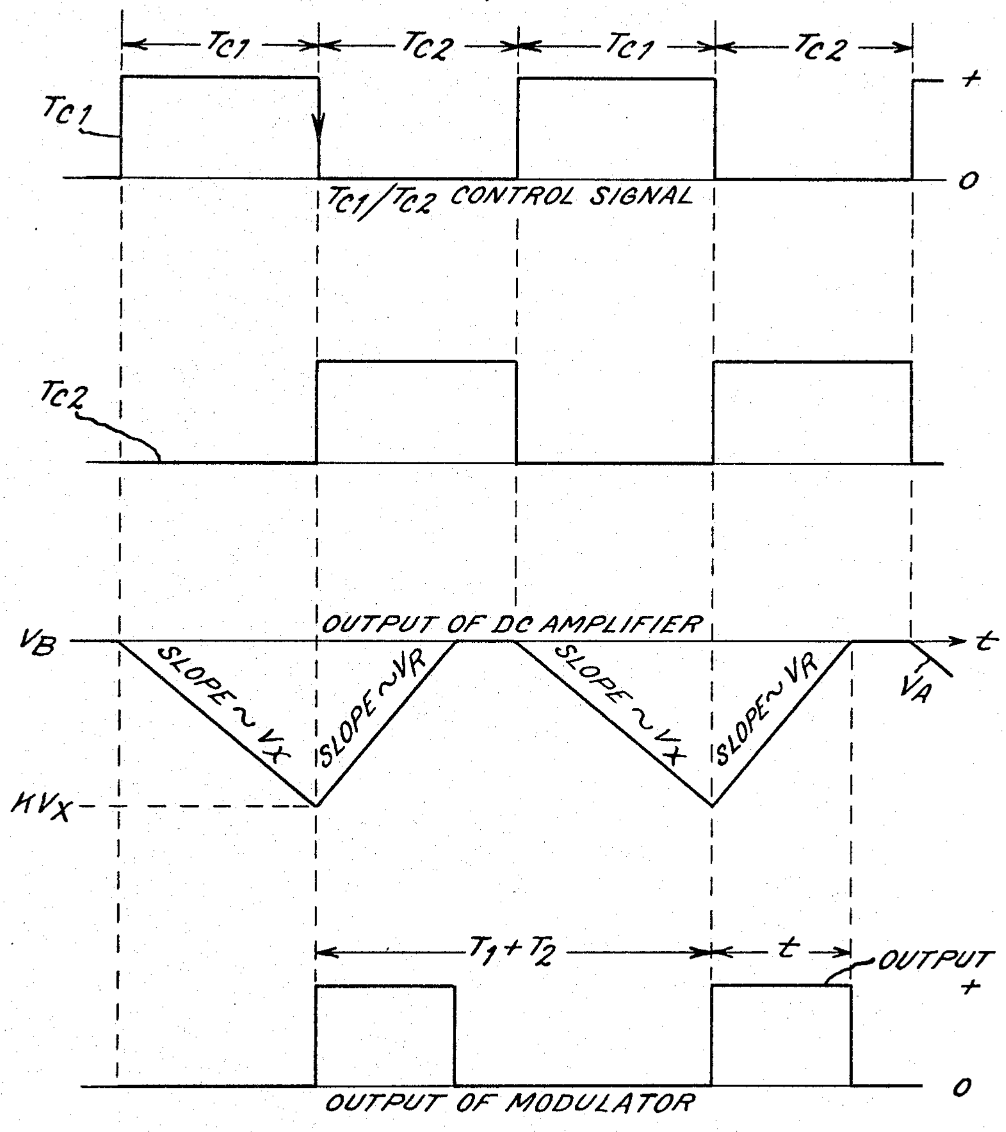

As illustrated by the FIGURE 3A waveforms, during period $T_{c1}$, input shunt switch 33 is opened by switching the transistor 43 to its high impedance state and integration by operational amplifier 34, integrating capacitor 35 and resistor 45 is produced in accordance with the variable input voltage $V_x$ and the fixed period $T_{c1}$. The trailing edge of the timing pulse $T_{c1}$ sets flip-flop 50 to the "1" state. The "1" output signal from flip-flop 50 is the output signal of the pulse width modulator, having a duration proportional to the input voltage $V_x$. This is achieved by having the integrating capacitor discharged during the output pulse by a discharge reference source $V_R$ and resistor 44. This discharge integration is controlled directly by the output flip-flop 50 through shunt switching transistor 42 in a manner similar to transistor 43.

The comparison and detection of the return of integrating capacitor 35 to its original state is preferably done with a single transistor 37 in the feedforward portion of the loop, and with a second transistor 38 driven by the transistor 37. Although cascaded transistors in the feedforward portion of the loop should theoretically give increased gain, in practice the dependence of $\beta$ on current leads to poorer results. The Zener diodes 47 and 39 respectively prevent saturation of D.-C. amplifier 34 and determine the output switching level for flip-flop 50 which is reset to terminate the output pulse width modulated signal.

While particular embodiments of the invention have been shown and described herein, it is not intended that the invention be limited to such disclosure, but that changes and modifications can be made and incorporated within the scope of the claims.

What is claimed is:

1. A pulse width modulator comprising:

(a) a closed loop electronic integrator including an operational amplifier;

(b) switching means for applying an input signal to said integrator during a first mode and a fixed reference signal during a second mode for integrating back towards the initial signal level;

(c) a limiter type circuit connected in the feedforward portion of said integrator loop as a comparator wherein the limiting signal is said integrator initial signal;

(d) said comparator circuit including a series amplifier having a nonlinear element which is connected so as to regeneratively drive said operational amplifier output signal magnitude towards saturation past the initial integrator signal whereby the pulse width termination is detected accurately and with a fast rise time;

(e) a source of pulse width modulated ouput pulses, which are initiated in synchronism with said switching means starting the second mode and have a duration equal to the time required to integrate back to the original signal level, in response to said comparator circuit.

2. A pulse width modulator comprising:

(a) an integrating capacitor;

(b) an analog operational amplifier coupled to said capacitor to provide a linear integrator;

(c) input gating means for connecting an input D.-C. voltage to said capacitor for a fixed time interval during a first system pulse cycle whereby a voltage is developed across said capacitor proportional to said input voltage;

(d) discharge reference voltage gating means for connecting a reference voltage signal to discharge said capacitor during a second system pulse cycle;

(e) a comparison reference voltage source;

(f) a comparator, responsive to the output of said integrator and said comparison reference source, for generating a signal upon discharge of said integrator to the original reference level;

(g) output means, responsive to said comparator, for making a cyclic pulse width modulated output signal available, having a time duration equal to the time required to discharge said capacitor.

3. A pulse width modulator comprising:

(a) an analog operational amplifier coupled to a capacitor to provide a linear integrator;

(b) input gating means for connecting an input D.-C. voltage to said capacitor, for integration in a first direction, for a fixed time interval during a first system pulse cycle whereby a voltage is developed across said capacitor proportional to said input voltage;

(c) discharge reference voltage gating means for connecting a reference voltage to discharge said capacitor, for integration in a reverse direction, during a second system pulse cycle;

(d) a single transistor having a nonlinear characteristic for providing regenerative action coupled in the feedforward portion of the integrator loop for comparing and detecting the return of said capacitor to its original condition;

(e) a comparison reference voltage source;

(f) a comparator, responsive to the output of said integrator and said comparison reference source, for generating a signal upon discharge of said integrator to the original reference level;

(g) an amplifier coupled in the feedback path of said integrator to regeneratively amplify said comparator operation;

(h) output means, responsive to said comparator, for making a cyclic pulse width modulated output signal available, having a time duration equal to the time required to discharge said capacitor.

References Cited by the Examiner

UNITED STATES PATENTS

| | | | |
|---|---|---|---|
| 3,045,071 | 7/1962 | Matthews et al. ------ | 332—9 X |
| 3,091,742 | 5/1963 | Van Arragon --------- | 332—9 |
| 3,246,247 | 4/1966 | Grindle ---------- | 329—106 X |

ROY LAKE, *Primary Examiner.*

A. L. BRODY, *Assistant Examiner.*